(12) United States Patent
Mori et al.

(10) Patent No.: US 6,967,493 B2
(45) Date of Patent: Nov. 22, 2005

(54) PROBE CARD AND CONTACTOR OF THE SAME

(75) Inventors: Chikaomi Mori, Yamaga (JP); Katsuhiko Satou, Yokohama (JP)

(73) Assignee: Japan Electronic Materials Corporation, Hyogo (JP)

( * ) Notice: Subject to any disclaimer, the term of this patent is extended or adjusted under 35 U.S.C. 154(b) by 0 days.

(21) Appl. No.: 10/925,861

(22) Filed: Aug. 25, 2004

(65) Prior Publication Data
US 2005/0083072 A1 Apr. 21, 2005

(30) Foreign Application Priority Data
Aug. 27, 2003 (JP) .............................. 2003-208946
Aug. 27, 2003 (JP) .............................. 2003-208947

(51) Int. Cl.$^7$ ........................................ G01R 31/02
(52) U.S. Cl. .................... 324/754; 324/758; 324/761; 324/762; 324/158.1
(58) Field of Search .............................. 324/755, 754, 324/158.1, 761, 758, 725, 765, 482; 439/912, 439/700, 70, 68, 682, 765; 29/852, 854

(56) References Cited

U.S. PATENT DOCUMENTS

| | | | | |
|---|---|---|---|---|
| 5,508,621 A | * | 4/1996 | Wong | 324/549 |
| 5,545,045 A | * | 8/1996 | Wakamatsu | 439/70 |
| 6,443,784 B1 | * | 9/2002 | Kimoto | 439/862 |
| 6,504,388 B2 | * | 1/2003 | Comulada et al. | 324/754 |
| 6,636,063 B2 | * | 10/2003 | Arnold et al. | 324/762 |
| 6,724,208 B2 | * | 4/2004 | Matsunaga et al. | 324/761 |
| 6,731,123 B2 | * | 5/2004 | Kimoto | 324/754 |
| 6,847,221 B2 | * | 1/2005 | Kimoto et al. | 324/762 |

FOREIGN PATENT DOCUMENTS

| | | |
|---|---|---|
| JP | 08-088060 | 4/1996 |
| JP | 8-88060 | 4/1996 |

OTHER PUBLICATIONS

Claim for U.S. Appl. No. 10/951,279; 6 pages.

* cited by examiner

Primary Examiner—Vinh Nguyen
Assistant Examiner—Jimmy Nguyen
(74) Attorney, Agent, or Firm—Meyertons, Hood, Kivlin, Kowert & Goetzel, P.C.; Eric B. Meyertons

(57) ABSTRACT

A probe card used for measuring electrical characteristics of a semiconductor device such as an LSI chip and comprising a contactor mounting substrate on which a plurality of contactors are arranged, in which the contactor comprises an insertion part for mounting the contactor on the contactor mounting substrate, a support part for supporting the insertion part and performing positioning in the height direction by contacting a surface of the contactor mounting substrate, an arm part extending from the support part, and a contact part arranged at a tip end of the arm part to come in contact with an electrode of an object to be tested, and the insertion part is detachably mounted on an electrode hole provided in the surface of the contactor mounting substrate and made to be conductive by a wiring pattern.

14 Claims, 15 Drawing Sheets

PROBE CARD AND CONTACTOR OF THE SAME

BACKGROUND OF THE INVENTION

1. Field of the Invention

The present invention relates to a probe card which measures electrical characteristics of a semiconductor device such as an LSI chip and it relates to a mounting structure of a contactor which comes in contact with the semiconductor device.

2. Description of the Background Art

There are a lateral type called cantilever type and a vertical type called perpendicular type in a probe card which measures electrical characteristics of a semiconductor device such as an LSI chip. The lateral type probe card has an aspect which is not suitable for measuring many chips at the same time, which is required under the circumstances in which large-scale integration of the LSI chip is implemented and a tester is multiplexed, hence its use is decreasing. Meanwhile, since the vertical type probe card can use many probes and provides a high degree of freedom for a probe arrangement and it is suitable for measuring many chips at the same time, it is mainly used at present.

As shown in FIG. 8, a vertical type probe card A comprises a main substrate 1 having a first connection electrode 4 which comes into contact with a measuring device for testing such as a tester (not shown), a sub-substrate 3 having a plurality of through holes 9 which are electrically connected to the first connection electrode, a connection pin 7 which is detachably inserted in the through hole 9, a space transformer 2 provided with a plurality of contactors 6, in which the connection pin 7 protrudes from one main surface 2a and a plurality of contactors 6 provided in the other main surface 2b comes into contact with a semiconductor device (not shown) which is an object to be measured such as an IC chip, and a holding 10 for detachably mounting the space transformer 2 on the main substrate 1.

When the semiconductor device such as the LSI chip is tested, it is required that a plurality of chips are measured at the same time. Recently, there is a demand for a probe card having high stability in electrical contact, a high performance and high reliability even when the number of electrodes of the probe card used in the test is further increased. In addition, since an operation current is very small and contacts are repeated many times in the above probe card, stability of contact pressure of its contactor or stability and preservation of its electrical conductive characteristics are especially required. In addition, responses are also required for deformation or damage which could be generated because of an impact or vibration of the contacts.

The semiconductor device is measured in such a manner that the contactor 6 of the probe card is pressed against an object to be tested such as an IC chip (not shown), and a measuring device for testing such as a tester (not shown) is brought into contact with the first connection electrode 4 of the main contactor mounting substrate 1. However, as shown in FIG. 8, according to the conventional probe card, since the contactor 6 is fixed by soldering directly to the contactor mounting substrate (space transformer 2), when deformation or a damage of the contactor 6 because of repetitive contacts is generated, it is necessary to exchange the contactor mounting substrate (space transformer 2) itself, which is very ineffective in terms of time and economical efficiency.

FIG. 9 also shows a conventional example, in which a contactor mounting substrate (space transformer 2) is separated. Although there is an improvement as compared with an example shown in FIG. 8, the economical efficiency is still ineffective.

SUMMARY OF THE INVENTION

The present invention is made to solve the above problems in the conventional probe card. It is an object of the present invention to provide a probe card in which excellent contact stability with an object to be tested is provided and only a contactor which is deformed or damaged because of repetitive contacts can be easily exchanged.

In addition, it is another object of the present invention to provide a contactor which is excellent in contact stability with an object to be measured and easily exchanged when deformation or a damage is generated because of repetitive contacts.

In order to attain the above objects, a probe card according to the present invention has a contactor mounting substrate on which a plurality of contactor are provided, in which the contactor comprises an insertion part for mounting the contactor on the contactor mounting substrate, a support part for supporting the insertion part and performing positioning in the height direction by contacting the surface of the contactor mounting substrate, an arm part extending from the support part, and a contact part arranged at a tip end of the arm part to come in contact with an electrode of an object to be tested, and the insertion part is detachably mounted on an electrode hole provided in the surface of the contactor mounting substrate and made to be conductive by a wiring pattern.

Furthermore, in order to attain the above objects, according to the probe card of the present invention, the insertion part of the contactor has a spring characteristics and comes into contact with an inner part of the electrode hole so as to be pressed.

Furthermore, in order to attain the above objects, according to the probe card of the present invention, a plurality of electrode holes which are made to be conductive by the wiring pattern on the surface of the contactor mounting substrate are provided for one contactor.

Furthermore, in order to attain the above objects, a contactor of the present invention is a contactor for a probe card to be mounted on the contactor mounting substrate, in which the contactor comprises an insertion part having spring characteristics for mounting the contactor on the contactor mounting substrate, a support part for supporting the insertion part and performing positioning in the height direction by contacting the surface of the contactor mounting substrate, an arm part extending from the support part, and a contact part arranged at a tip end of the arm part to come in contact with an electrode of an object to be tested.

In addition, in order to attain the above objects, the contactor according to the present invention has a plurality of insertion parts to be inserted into the contactor mounting substrate, whose number is the same as or less than the number of electrode holes for one contactor.

In addition, in order to attain the above objects, according to the contactor of the present invention, the arm part of the contactor has spring characteristics.

In addition, in order to attain the above objects, according to the contactor of the present invention, the arm part of the contactor has a curved shape.

In addition, in order to attain the above objects, according to the contactor of the present invention, the arm part of the contactor is linear and a plate spring part is provided so as to be adjacent to the linear arm part and sandwiched between the arm part and the insertion part.

In order to attain the above objects, a probe card of the present invention has a contactor mounting substrate on which a plurality of contactor are provided, in which the contactor comprises an insertion part for mounting the contactor on the contactor mounting substrate, a support part for supporting the insertion part and performing positioning in the height direction by contacting a surface of the contactor mounting substrate, an electrode part extending from the support part, an arm part extending also from the support part, and a contact part arranged at a tip end of the arm part to come in contact with an electrode of an object to be tested, the insertion part is detachably mounted on an contactor mounting hole provided in the surface of the contactor mounting substrate, and the electrode part is in contact with a wiring pattern on the contactor mounting substrate.

In addition, in order to attain the above objects, according to the probe card of the present invention, the insertion part of the contactor has a spring characteristics and comes into contact with an inner part of the contactor mounting hole so as to be pressed.

In addition, in order to attain the above objects, according to the probe card of the present invention, a plurality of contactor mounting holes of the contactor mounting substrate are provided for one contactor.

In addition, in order to attain the above objects, according to the probe card of the present invention, the electrode part of the contactor has a spring characteristics and it comes in contact with the wiring pattern on the contactor mounting substrate so as to be pressed.

In order to attain the above objects, a contactor of the present invention is a contactor for a probe card to be mounted on a contactor mounting substrate, in which the contactor comprises an insertion part having a spring characteristics for mounting the contactor on the substrate, a support part for supporting the insertion part and performing positioning in the height direction by contacting the surface of the contactor mounting substrate, an electrode part extending from the support part, an arm part extending from the support part, and a contact part arranged at a tip end of the arm part to come in contact with an electrode of an object to be tested.

In addition, in order to attain the above objects, the contactor of the present invention has a plurality of insertion parts to be inserted into the contactor mounting substrate, whose number is the same as or less than the number of contactor mounting holes for one contactor.

In addition, in order to attain the above objects, according to the contactor of the present invention, the electrode part has a spring characteristics.

In addition, in order to attain the above objects, according to the contactor of the present invention, the arm part has a spring characteristics.

In addition, in order to attain the above objects, according to the contactor of the present invention, the arm part has a curved shape.

In addition, in order to attain the above objects, according to the contactor of the present invention, the arm part of the contactor is linear and a plate spring part is provided so as to be adjacent to the linear arm part and sandwiched between the arm part and the insertion part.

DESCRIPTION OF THE PREFERRED EMBODIMENTS

Hereinafter, embodiments of the present invention are described with reference to the drawings.

Embodiment 1

Figure 1:
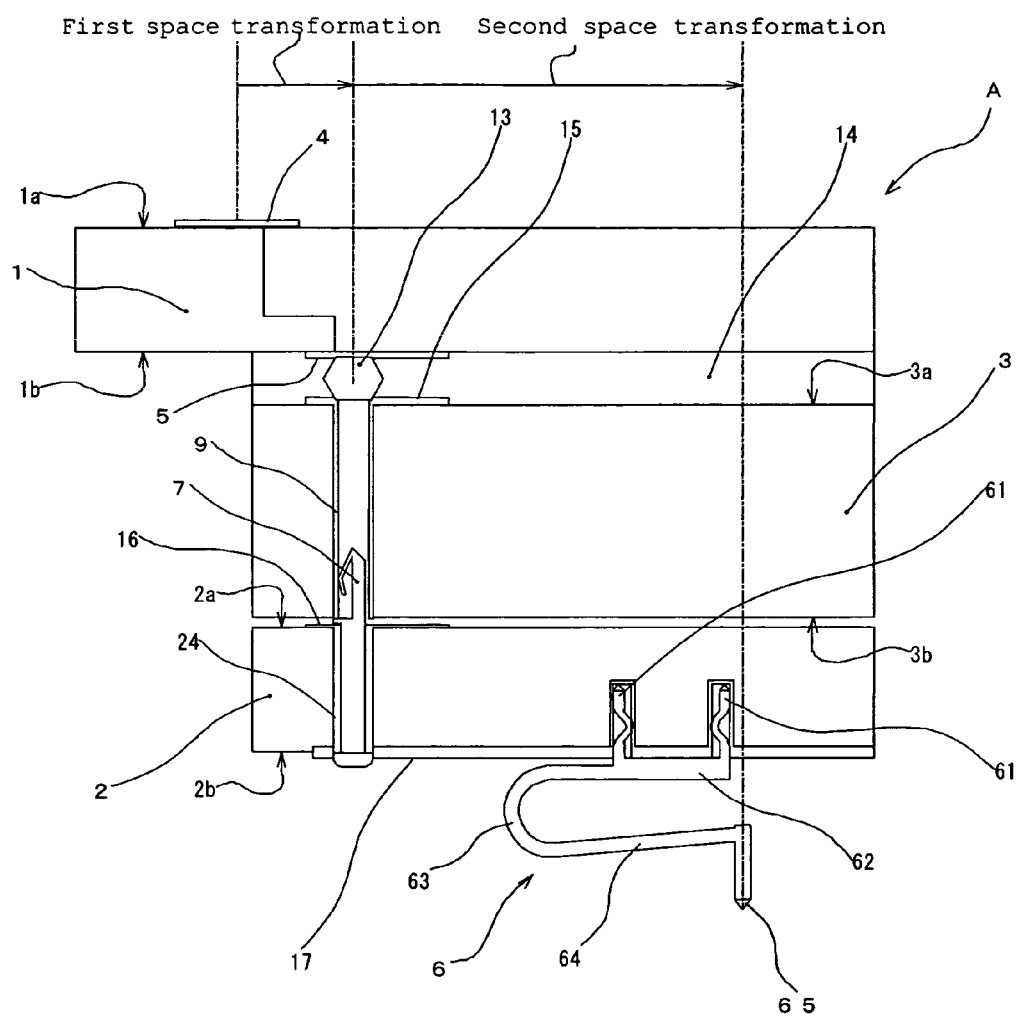
FIG. 1 is a schematic view of a cross section showing a part of a probe card provided with a detachable contactor according to the present invention.
Figure 2:
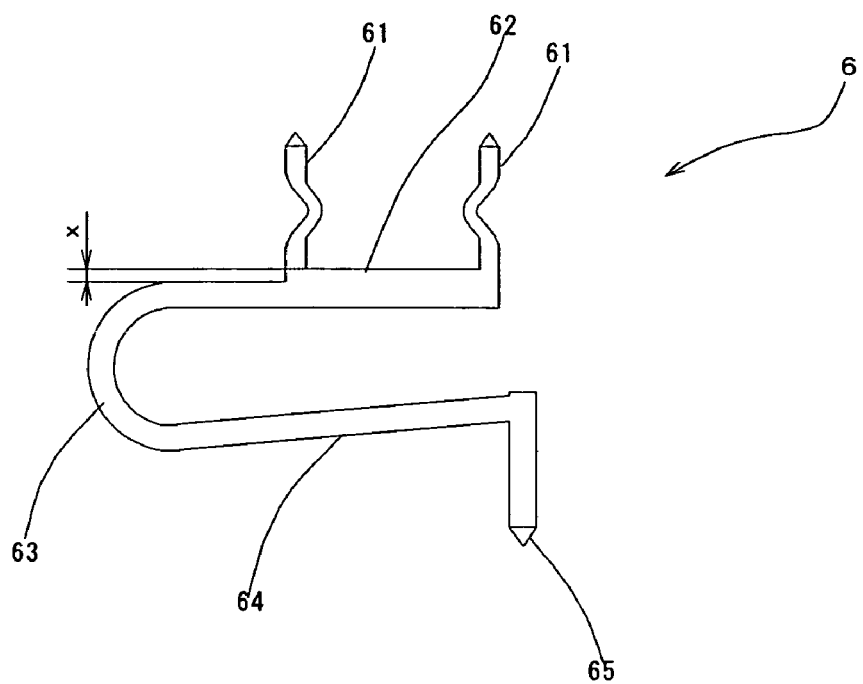
FIG. 2 is an enlarged side view showing the detachable contactor according to the present invention.
Figure 3:
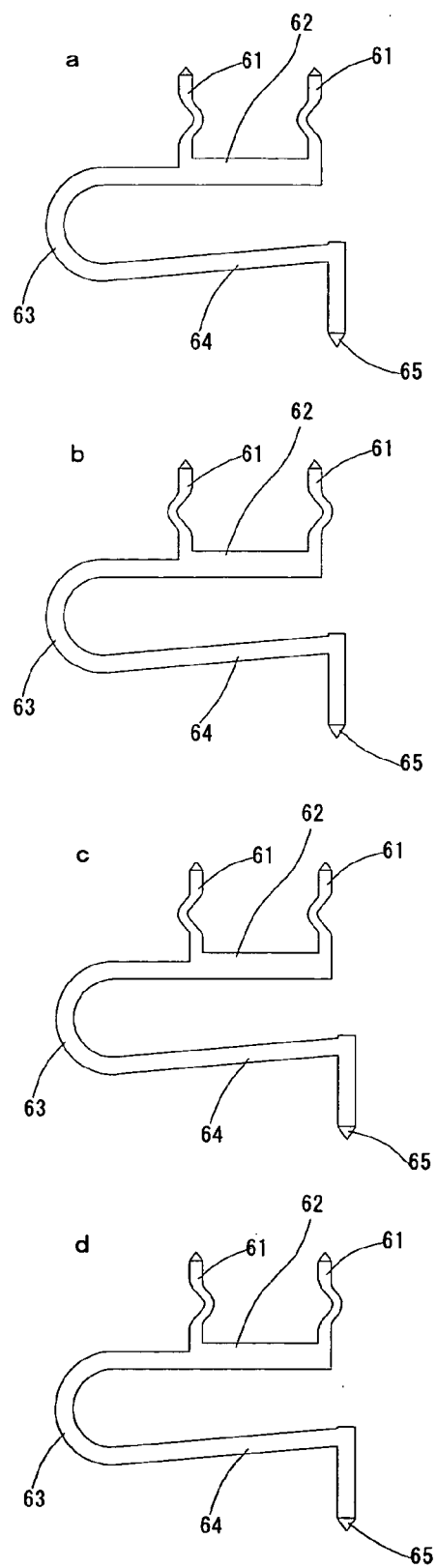
FIG. 3(a) is an enlarged side view showing an embodiment of the detachable contactor according to the present invention.
FIG. 3(b) is an enlarged side view showing another embodiment of the detachable contactor of the present invention.
FIG. 3(c) is an enlarged side view showing still another embodiment of the detachable contactor of the present invention.
FIG. 3(d) is an enlarged side view showing still another embodiment of the detachable contactor of the present invention.
Figure 4:
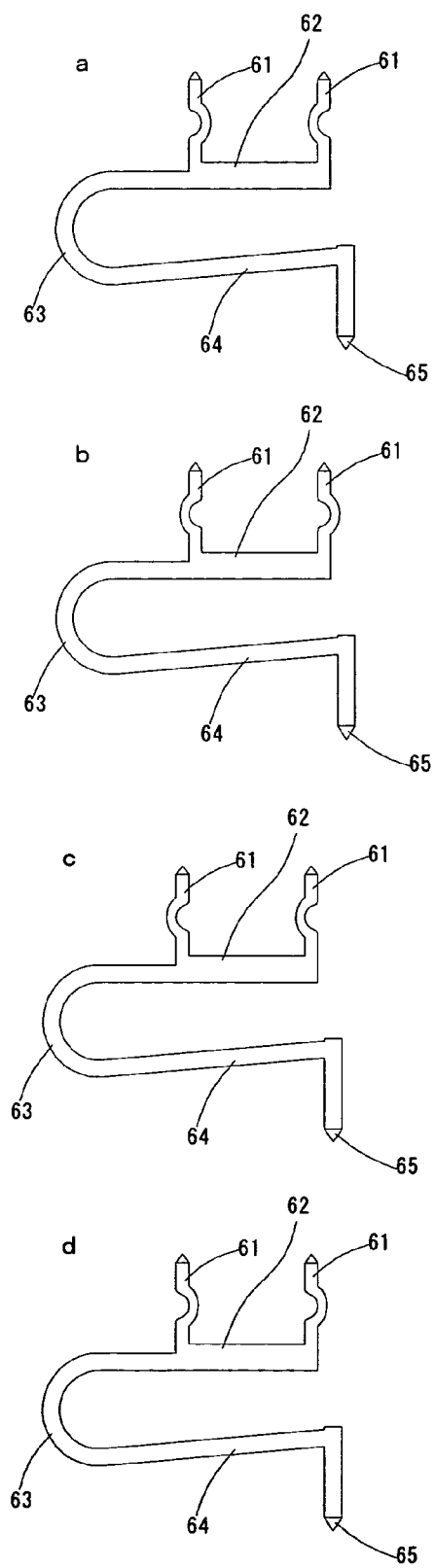
FIG. 4(a) is an enlarged side view showing still another embodiment of the detachable contactor according to the present invention.
FIG. 4(b) is an enlarged side view showing still another embodiment of the detachable contactor of the present invention.
FIG. 4(c) is an enlarged side view showing still another embodiment of the detachable contactor of the present invention.
FIG. 4(d) is an enlarged side view showing still another embodiment of the detachable contactor of the present invention.
Figure 5:
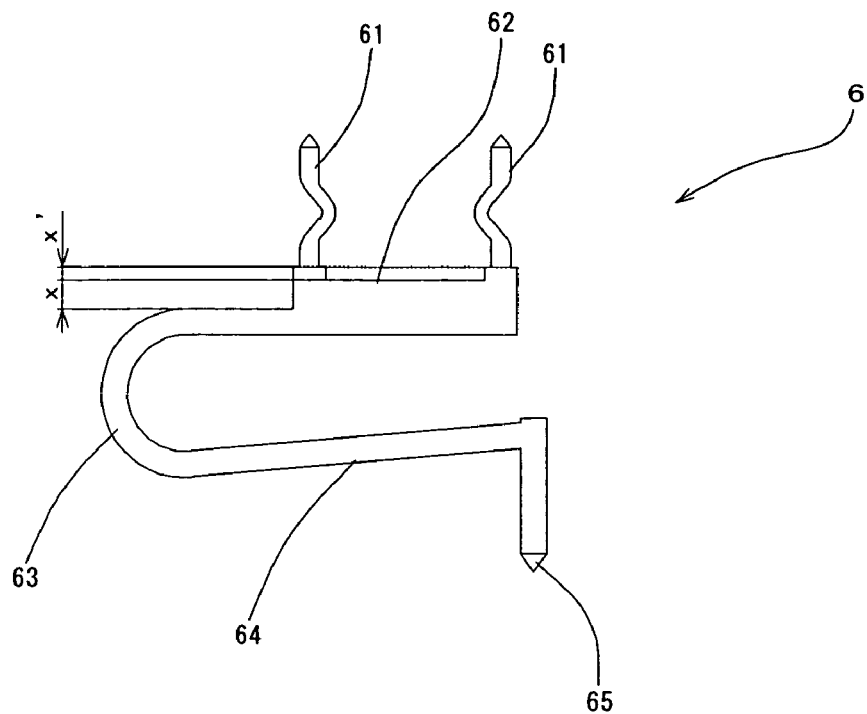
FIG. 5 is an enlarged side view showing another detachable contactor of the present invention.
Figure 6:
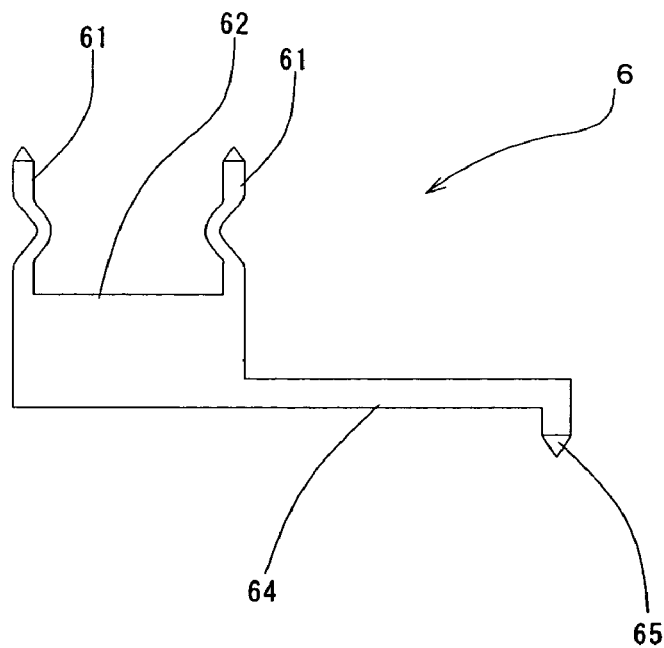
FIG. 6 is an enlarged side view showing still another detachable contactor of the present invention.
Figure 7:
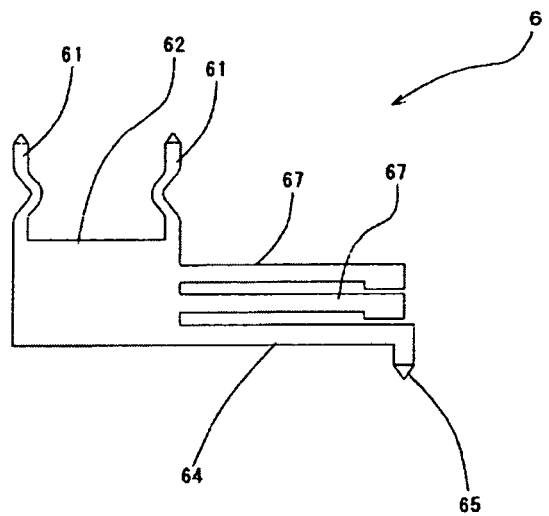
FIG. 7 is an enlarged side view showing still another detachable contactor of the present invention.
Figure 8:
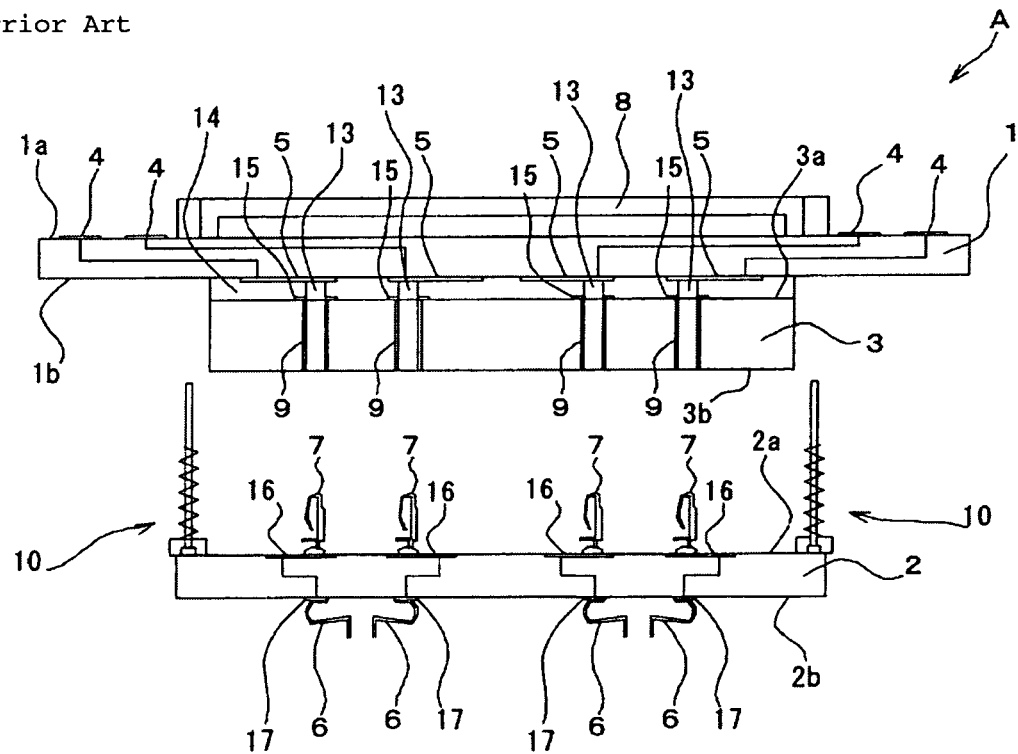
FIG. 8 is an exploded schematic view showing a sectional structure of a probe card having a conventional contactor connecting pattern.
Figure 9:
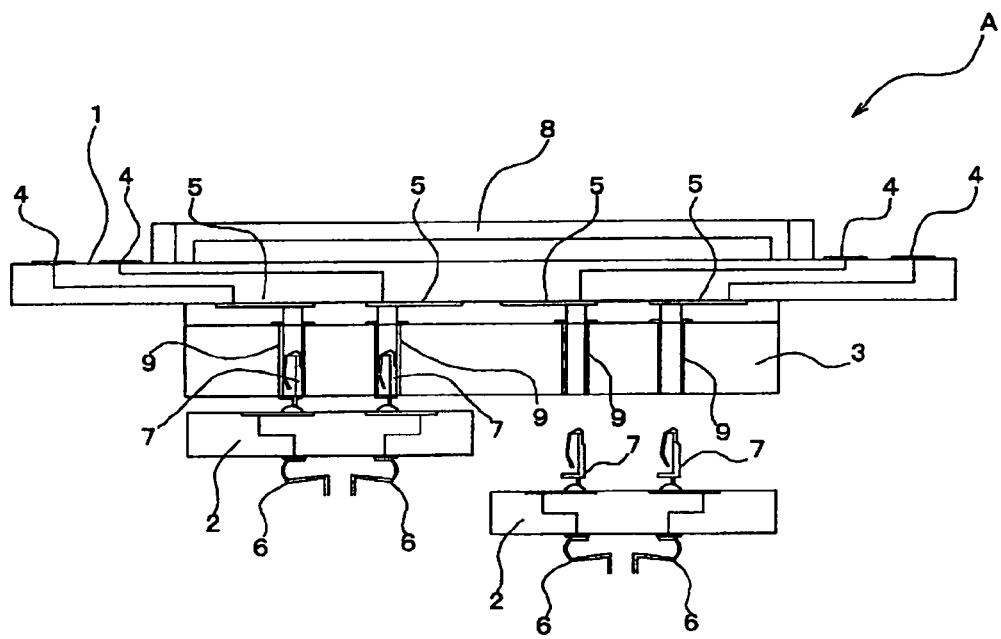
FIG. 9 is an exploded schematic view showing another sectional structure of a probe card having a conventional contactor connecting pattern.

FIG. 1 is a sectional view showing a part of a probe card A provided with a detachable contactor 6 of the present invention, FIG. 2 is an enlarged view showing the detachable contactor 6 of the present invention, FIG. 3a to 3d are views showing a variation of shapes of insertion parts 61, FIG. 4a to 4d are views showing another variation of the shapes of the insertion parts 61, FIG. 5 is an enlarged view showing another detachable contactor 6 of the present invention, FIG. 6 is an enlarged view showing still another detachable contactor 6 of the present invention, FIG. 7 is an enlarged view showing still another detachable contactor 6 of the present invention, FIG. 8 is an exploded schematic view showing a sectional structure of a probe card having a conventional connecting pattern of a contactor, and FIG. 9 is an exploded schematic view showing another sectional structure of a probe card having a conventional connecting pattern of a contactor.

FIG. 1 is a sectional view showing a part of a probe card A provided with a detachable contactor 6 of the present invention. The probe card A comprises a main substrate 1 having a first connection electrode 4 which electrically comes into contact with a measuring device for testing such as a tester (not shown), a sub-substrate 3 having a plurality of through holes 9 (only one of them is shown) which are electrically connected to the first connection electrode, a connection pin 7 which is detachably inserted in the through hole 9, and a space transformer 2 provided with a plurality of contactors (only one of them is shown) 6, in which the pin 7 protrudes from one main surface 2a and the contactor 6 provided in the other main surface 2b comes into contact with a semiconductor device (not shown) which is an object to be tested such as an IC chip. Although a description is made assuming that a contactor mounting substrate on which the contactors 6 are mounted is the space transformer 2 hereinafter, it is needless to say that the substrate is not limited to the space transformer and it may be a substrate in which space transformation is not performed.

The main substrate 1 comprises a plurality of first connection electrodes 4 (only one of them is shown) on a first main surface 1a, which are electrically connected to the measuring device for testing and a plurality of second connection electrodes 5 (only one of them is shown) on a second main surface 1b, which are electrically connected to the sub-substrate 3 to be described below, and the second connection electrode 5 and the first connection electrode 4 are electrically connected through a wiring in the main substrate 1.

The first connection electrodes 4 are arranged on the first main surface 1a of the main substrate 1 so as to be widely spaced to correspond to space between electrodes of the measuring device by transforming narrow space between the adjacent second connection electrodes on the second main surface 1b to wide space between the adjacent first connection electrodes on the first main surface 1a.

The sub-substrate 3 comprises a first main surface 3a which is opposed to the second main surface 1b of the main substrate 1, a second main surface 3b which is opposed to the first main surface 2a of the space transformer 2 to be described later, and a plurality of through holes 9 (only one of them is shown) between the first main surface 3a and the second main surface 3b.

The through holes 9 having an electrically conductive plated layer penetrate between the first main surface 3a and the second main surface 3b and they are electrically connected to a plurality of the third connection electrodes 15 (only one of them is shown) arranged on the first main surface 3a.

The space between the third connection electrode 15 of the sub-substrate 3 and the second connection electrode 5 of the main substrate 1 is connected by an electrically conductive material 13 such as soldering or a conductive resin and other space between the second main surface 1b of the main substrate 1 and the opposed first main surface 3a of the sub-substrate 3 is filled with a bonding resin material 14. Thus, the sub-substrate 3 is integrally provided with the main substrate 1 while they are electrically connected to it.

The connection pin 7 provided in the space transformer 2 is inserted into the through hole 24 of the space transformer 2 and also detachably inserted into the through hole 9 of the sub-substrate 3 so as to be elastically in contact with the through hole 9 having the conductive plated layer.

The space transformer 2 comprises the first main surface 2a which is opposed to the second main surface 3b of the sub-substrate 3, and the second main surface 2b on which a plurality of contactors 6 (only one of them is shown) to be connected to electrode pads (not shown) arranged at high density in a semiconductor device are provided.

There are provided electrode holes to which the contactors 6 (only one of them is shown) are inserted, in the space transformer 2 as end holes, and the contactor insertion parts 61 are inserted into the end holes.

Alternatively, wiring patterns arranged on front and back surfaces of the space transformer 2 are connected to through holes (not shown) penetrating the space transformer 2 and the contactor insertion parts 61 are inserted into the through holes serving as electrode holes.

A plurality of electrode holes of the space transformer 2 are provided for one contactor 6 and the contactor 6 has a plurality of insertion parts 61 whose number is the same as that of the electrode holes or less than it. The contact comprises a plurality of insertion parts, so that the direction of the contact can be decided. In addition, since they are pressed with spring characteristics in the electrode holes, they can be surely positioned, mounted, fixed and electrically connected.

The contactor 6 comprises a plurality of insertion parts 61 for mounting the contactor 6 on the space transformer 2 as shown in FIG. 2, a support part 62 for supporting the insertion parts 61 and performing positioning in the height direction by contacting with a surface of the space transformer 2, an arm part 64 extending from the support part 62 and including a curve part 63, and a contact part 65 positioned at a tip end of the arm part 64 to come into contact with an electrode of the tested object. The insertion parts 61 are detachably inserted into the electrode holes which are provided in the surface of the space transformer 2 and made to be electrically conductive by a wiring pattern.

As shown in FIG. 1, the connection pin 7 is connected to the insertion part 61 of the contactor 6 by a wiring pattern (fifth connection electrode 17) arranged on the surface 2b of the space transformer 2. Thus, the first connection electrode 4 can be connected to the contact part 65 such that space is transformed from a first space to a second space.

The insertion parts 61 of the contactor 6 to be inserted into the electrode holes of the space transformer 2 have spring characteristics in the shape of doglegs or reversed doglegs as shown in FIGS. 3a to 3d, or in the shape of "C" or reversed "C" as shown in FIGS. 4a to 4d, which come in contact with the inside of the electrode holes with pressure.

The insertion parts 61 may be a combination in the shape of doglegs or may be a combination in the shape of reversed doglegs, each other in the opposite direction as shown in FIG. 2 or FIGS. 3a and 3b, or may be a combination in the shape of doglegs or may be combination in the shape of reversed doglegs, each other in the same direction as shown in FIGS. 3c and 3d.

Alternatively, the insertion parts 61 may be a combination in the shape of "C" or may be a combination in the shape of reversed "C", each other in the opposite direction as shown in FIG. 4a and 4b, or may be a combination in the shape of "C" or may be a combination in the shape of reversed "C", each other in the same direction as shown in FIGS. 4c and 4d.

In addition, the insertion parts 61 may be a combination of the doglegged configuration and the C-shaped configuration or may be a combination of those in the different direction although they are not shown.

Here, since it is a major point of the present invention that the insertion parts 61 are in contact with the electrode holes with spring characteristics, it is needless to say that they are not limited to the doglegged configuration nor the C-shaped configuration.

In view of preventing a generation of a short-circuit or a noise or avoiding disconnection of a wiring pattern, it is preferable that the support part 62 is thicker than other parts in the contactor 6 so as to be hardly bent to surely support the insertion parts 61 and a space shown by "x" in FIG. 2 is provided when the insertion parts 61 are mounted to prevent the curve part 63 from being in contact with the surface of the space transformer 2.

The contactor 6 is preferably made from an electrically well-conductive metal material such as copper (Cu), nickel (Ni) or the like by etching, pressing or electroforming and plated with gold (Au) or tin (Sn) after the contact part 65 is molded and polished. According those processing method, since it can be molded without bending the metal, metal fatigue caused by bending processing does not remain, so that spring characteristics will not deteriorate even after repeatedly used, and excellent durability can be provided.

FIG. 5 shows an example in which the support part 62 is off the space transformer 2, so that space shown by "x'" therein is provided to pass the wiring pattern between the two insertion parts 61. The space shown "x" in FIG. 5 is provided when the insertion part is inserted like in FIG. 2, to prevent the curve part 63 from coming in contact with the surface of the space transformer 2.

FIG. 6 shows an example in which the arm part 64 does not have a curve part and it has a linear configuration. The configuration of the arm part 64 can be appropriately changed depending on the configuration of the semiconductor device to be tested.

FIG. 7 shows an example in which plate spring parts 67 are provided so as to be adjacent to the linear arm part 4 and sandwiched between the arm part 64 and the insertion parts 61. In this structure, spring pressure is gradually increased depending on a deformation amount of the arm part 64 and the contact part 65 can be surely in contact with the electrode of the object to be tested. Although two spring parts 67 are provided in FIG. 7, it is needless to say that it may be provided one, or two or more.

In addition, it is apparent that the present invention is not limited to the detailed configurations of the contactor illustrated in the above.

Embodiment 2

Figure 10:
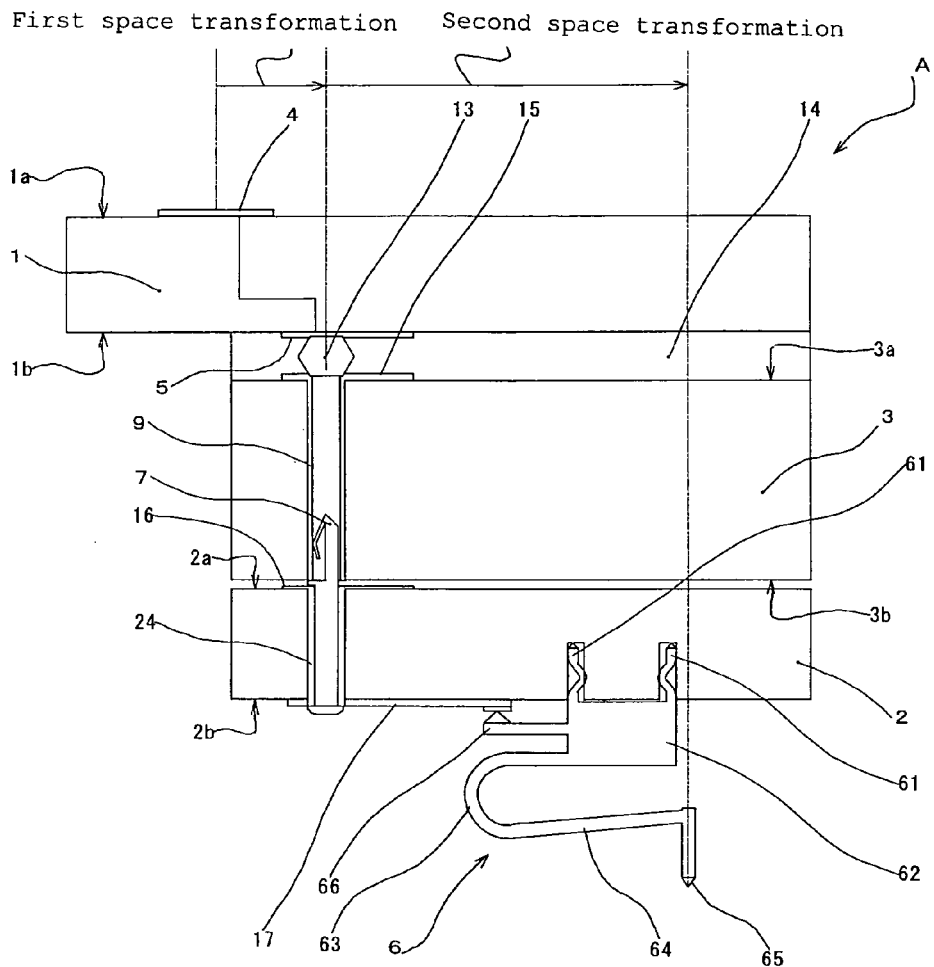
FIG. 10 is a schematic view of a cross section showing a part of a probe card provided with another detachable contactor according to the present invention.
Figure 11:
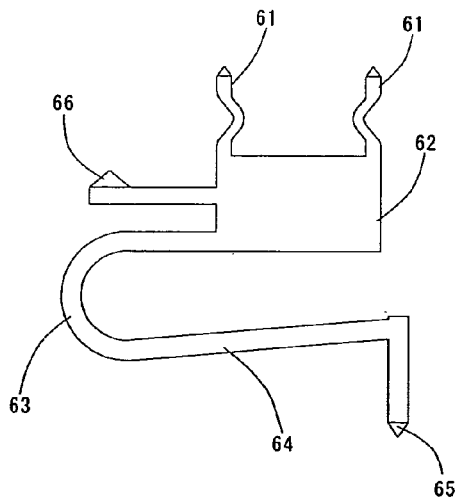
FIG. 11 is an enlarged side view showing another detachable contactor of the present invention.
Figure 12:
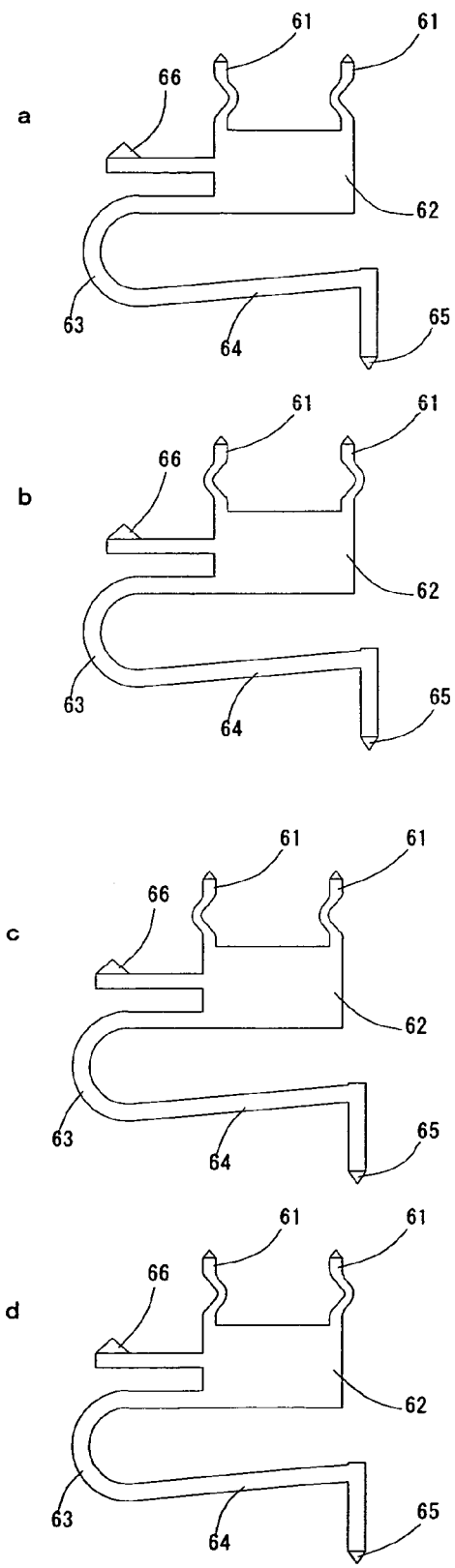
FIG. 12(a) is a side view showing an embodiment of still another detachable contactor of the present invention.
FIG. 12(b) is a side view showing still another embodiment of still another detachable contactor of the present invention.
FIG. 12(c) is a side view showing still another embodiment of still another detachable contactor of the present invention.
FIG. 12(d) is a side view showing still another embodiment of still another detachable contactor of the present invention.
Figure 13:
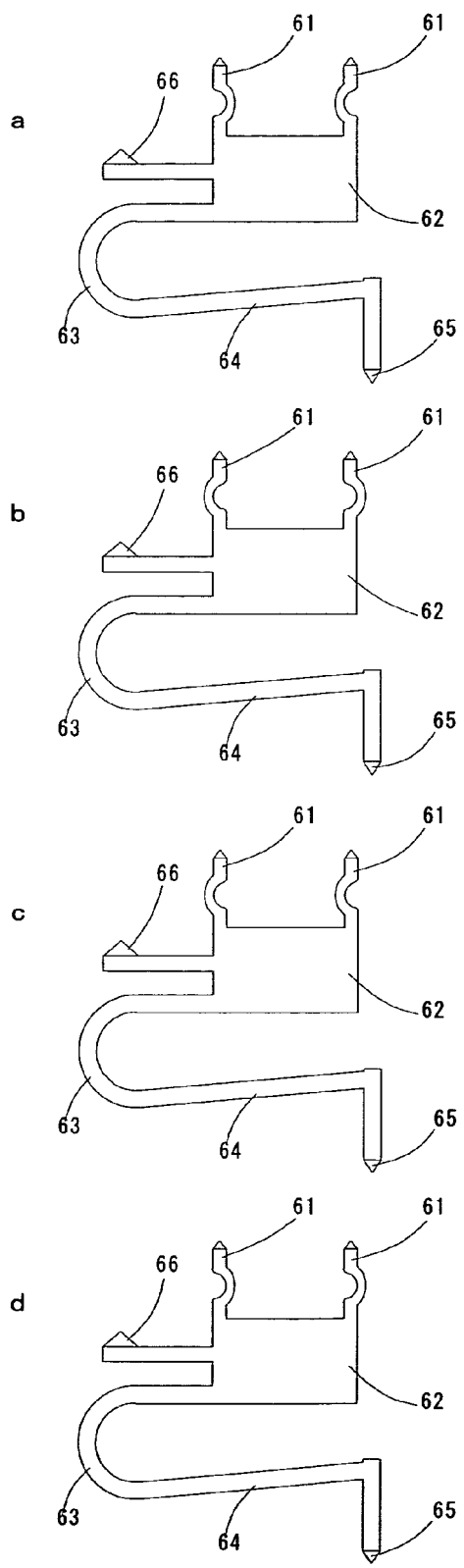
FIG. 13(a) is a side view showing still another embodiment of still another detachable contactor of the present invention.
FIG. 13(b) is a side view showing still another embodiment of still another detachable contactor of the present invention.
FIG. 13(c) is a side view showing still another embodiment of still another detachable contactor of the present invention.
FIG. 13(d) is a side view showing still another embodiment of still another detachable contactor of the present invention.
Figure 14:
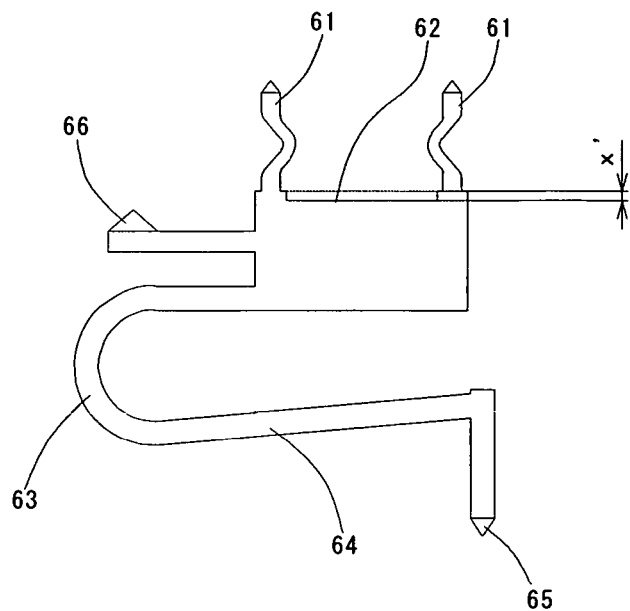
FIG. 14 is an enlarged side view showing still another detachable contactor of the present invention.
Figure 15:
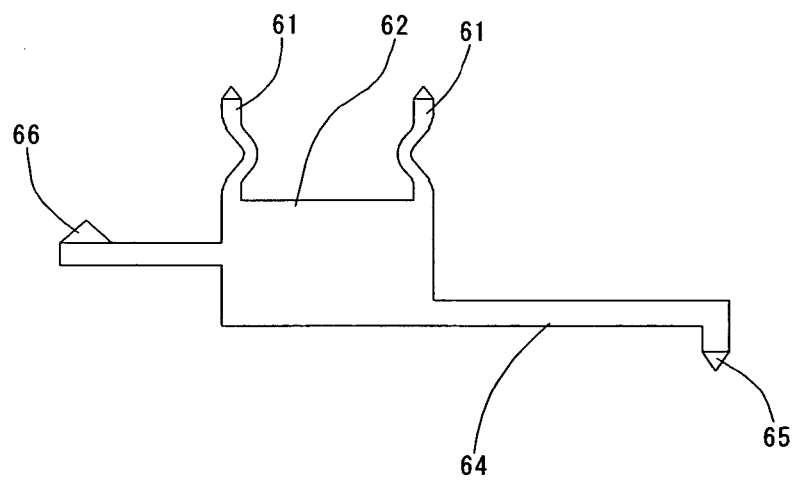
FIG. 15 is an enlarged side view showing still another detachable contactor of the present invention.
Figure 16:
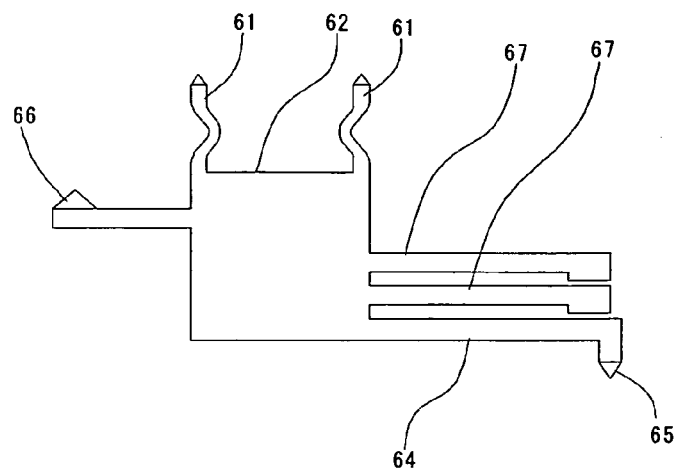
FIG. 16 is an enlarged side view showing still another detachable contactor of the present invention.
Figure 17:
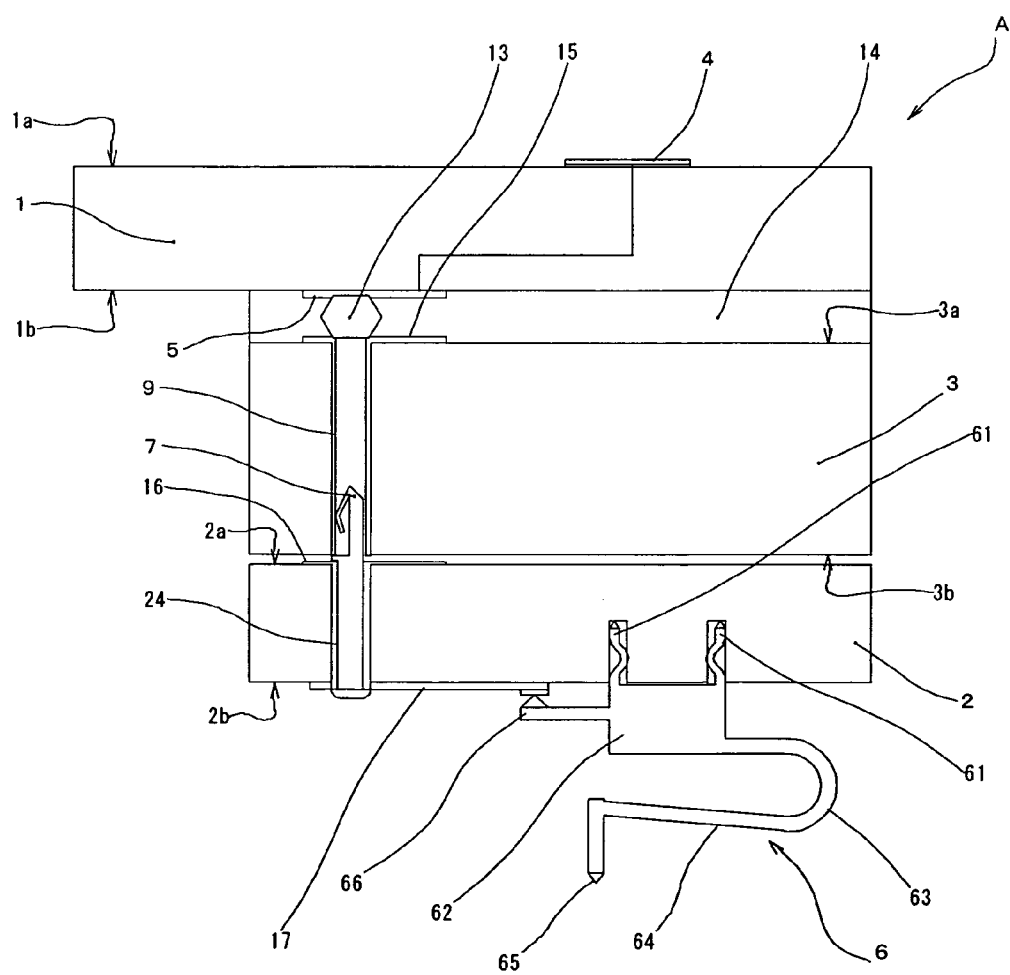
FIG. 17 is a schematic view of a cross section showing a part of a probe card provided with still another detachable contactor according to the present invention.
Figure 18:
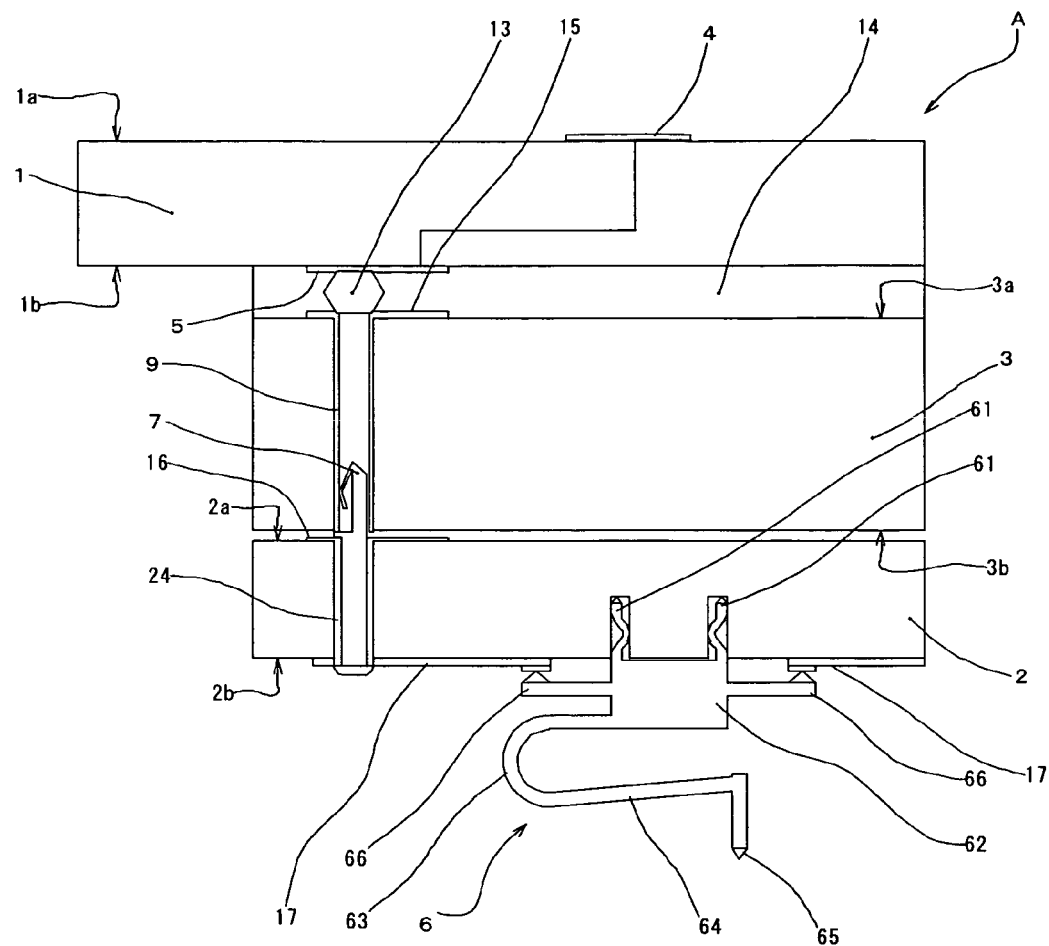
FIG. 18 is a schematic view of a cross section showing a part of a probe card provided with still another detachable contactor according to the present invention.
Figure 19:
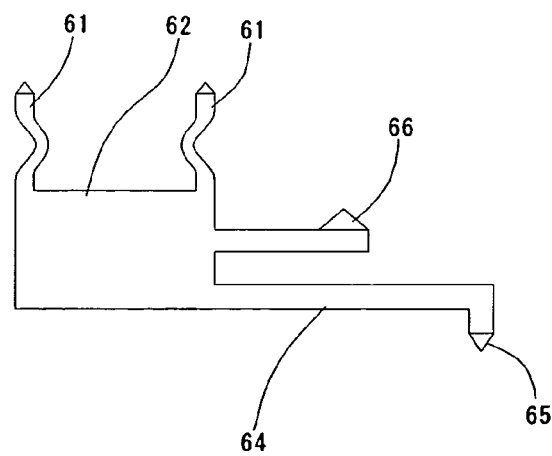
FIG. 19 is an enlarged side view showing still another detachable contactor of the present invention.
Figure 20:
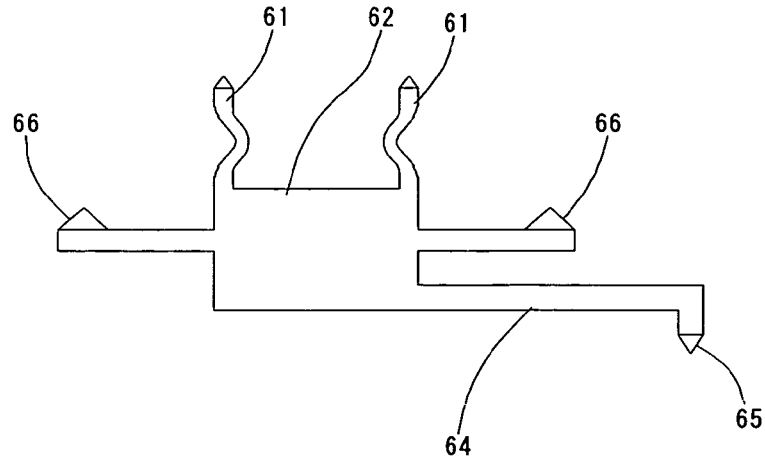
FIG. 20 is an enlarged side view showing still another detachable contactor of the present invention.
Figure 21:
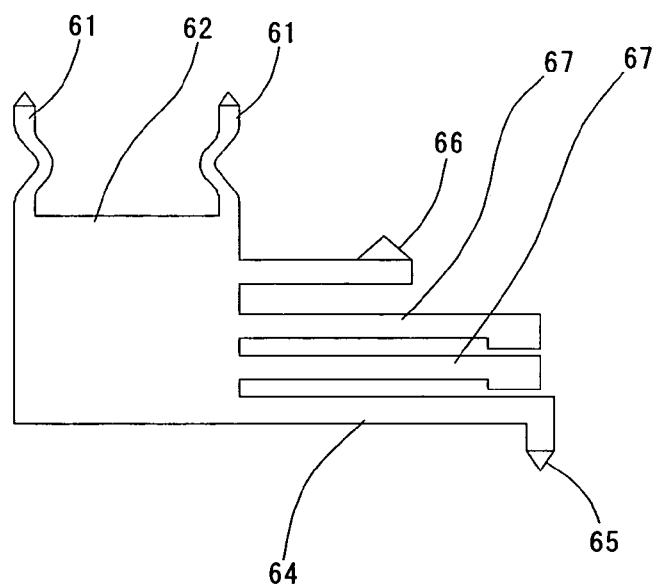
FIG. 21 is an enlarged side view showing still another detachable contactor of the present invention.
Figure 22:
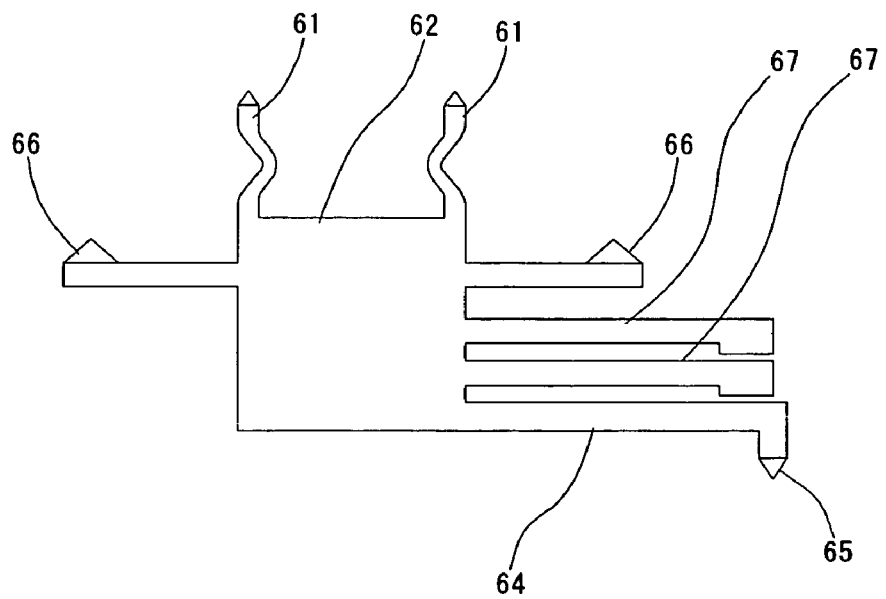
FIG. 22 is an enlarged side view showing still another detachable contactor of the present invention.

FIG. 10 is a sectional view showing a part of a probe card A provided with a detachable contactor 6 of the present invention, FIG. 11 is an enlarged view showing the detachable contactor 6 of the present invention, FIGS. 12a to 12d are views showing a variation of configurations of insertion parts 61, FIGS. 13a to 13d are views showing another variation of the configurations of the insertion parts 61, FIG. 14 is an enlarged view showing another detachable contactor 6 of this embodiment of the present invention, FIG. 15 is an enlarged view showing still another detachable contactor 6 of this embodiment of the present invention, FIG. 16 is an enlarged view showing still another detachable contactor 6 of this embodiment of the present invention, FIG. 17 shows an example in which an electrode part 66 in an example shown in FIG. 10 protrudes in the opposite direction from the arm part 64 (including the curve part 63), FIG. 18 shows an example in which the electrode part 66 in an example shown in FIG. 10 protrudes from both sides of a support part 62, FIG. 19 shows an example in which the electrode part 66 in an example shown in FIG. 15 protrudes in the same direction as an arm part 64, and FIG. 20 shows an example in which the electrode part 66 in an example shown in FIG. 15 protrudes from both sides of the support part 64. FIG. 21 shows an example in which the electrode part 66 in an example shown in FIG. 16 protrudes in the same direction as the arm part 64 and a spring part 67 and FIG. 22 shows an example in which the electrode part 66 in an example shown in FIG. 16 protrudes from both sides of the support part 62.

FIG. 10 is a sectional view showing a part of a probe card A provided with a detachable contactor 6 of the present invention. The probe card A comprises a main substrate 1 having a first connection electrode 4 which electrically comes into contact with a measuring device for testing such as a tester (not shown), a sub-substrate 3 having a plurality of through holes 9 (only one of them is shown) which are electrically connected to the first connection electrode, a connection pin 7 which is detachably inserted in the through hole 9, and a space transformer 2 provided with a plurality of contactors (only one of them is shown) 6, in which the connection pin 7 protrudes from one main surface 2a and the contactor 6 provided in the other main surface 2b comes into contact with a semiconductor device (not shown) which is an object to be measured such as an IC chip. Although a description is made assuming that a contactor mounting substrate on which the contactors 6 are mounted is the space transformer 2 hereinafter, it is needless to say that the substrate is not limited to the space transformer and it may be a substrate in which space transformation is not performed.

The main substrate 1 comprises a plurality of first connection electrodes 4 (only one of them is shown) on a first main surface 1a, which are electrically connected to the measuring device for testing and a plurality of second connection electrodes 5 (only one of them is shown) on a second main surface 1b, which are electrically connected to the sub-substrate 3 to be described below, and the second connection electrode 5 and the first connection electrode 4 are electrically connected through a wiring in the main substrate 1.

The first connection electrodes are arranged on the first main surface 1a of the main substrate 1 so as to be widely spaced to correspond to space between electrodes of the measuring device by transforming narrow space between the adjacent second connection electrodes on the second main surface 1b to wide space between the adjacent first connection electrodes on the first main surface 1a.

The sub-substrate 3 comprises a first main surface 3a which is opposed to the second main surface 1b of the main substrate 1, a second main surface 3b which is opposed to the first main surface 2a of the space transformer 2 to be described later, and a plurality of through holes 9 (only one of them is shown) between the first main surface 3a and the second main surface 3b.

The through holes 9 having a electrically conductive plated layer penetrate between the first mains surface 3a and the second main surface 3b and they are electrically connected to a plurality of third connection electrodes 15 (only one of them is shown) arranged on the first main surface 3a.

The space between the third connection electrode 15 of the sub-substrate 3 and the second connection electrode 5 of the main substrate 1 is connected by a conductive material 13 such as soldering or a conductive resin and other space between the second main surface 1b of the main substrate 1 and the opposed first main surface 3a of the sub-substrate 3 is filled with a bonding resin material 14. Thus, the sub-substrate 3 is integrally provided with the main substrate 1 while they are electrically connected.

The connection pin 7 provided in the space transformer 2 is inserted into the through hole 24 of the space transformer 2 and also detachably inserted into the through hole 9 of the sub-substrate 3 so as to be elastically in contact with the through hole 9 having the conductive plated layer.

The space transformer 2 comprises the first main surface 2a which is opposed to the second main surface 3b of the sub-substrate 3 and the second main surface 2b on which a plurality of contactors 6 (only one of them is shown) to be connected to electrode pads (not shown) arranged at high density in a semiconductor device are provided.

There are provided contactor mounting holes to which the contactors 6 (only one of them is shown) are inserted, in the space transformer 2 as end holes, and the contactor insertion parts 61 are inserted into the end holes.

Although the inner surface of the contactor mounting hole provided in the space transformer 2 as the end hole may be plated or not be plated, it is preferably plated in view of durability. However, since it is not easy to infiltrate a plating solution into a small hole due to the influence of surface tension, the plating process is not indispensable.

A plurality of contactor mounting holes of the space transformer 2 are provided for one contactor 6 and the contactor 6 has a plurality of insertion parts 61 whose number is the same as that of the contactor mounting holes or less than it. The contactor comprises a plurality of insertion parts, so that the direction of the contactor can be decided. In addition, since they are pressed with spring characteristics in the contactor mounting holes, they can be surely positioned, mounted and fixed. Thus, pressed contact of the electrode part 66 by spring pressure can be sufficiently provided and the electrical connection can be stable. In addition, since the specific electrode is provided other than the contactor mounting hole, the connection does not become unstable because of a plating defect in the contactor mounting hole.

The contactor 6 comprises a plurality of insertion parts 61 for mounting the contactor 6 on the space transformer 2 as shown in FIG. 11, the support part 62 for supporting the insertion parts 61 and performing positioning in the height direction by contacting with a surface of the space transformer 2, the electrode part 66 extending from the support part 62, the arm part 64 extending also from the support part 62 and including a curve part 63, and a contact part 65 positioned at a tip end of the arm part 64 to come into contact with an electrode of the tested object. The insertion parts 61 are detachably inserted into the contactor mounting holes which are provided in the surface of the space transformer 2 and the electrode part 66 is electrically connected to the electrode provided on the wiring pattern on the space transformer 2.

As shown in FIG. 10, the connection pin 7 is connected to the insertion part 61 of the contactor 6 by a wiring pattern (fifth connection electrode 17) arranged on the surface 2b of the space transformer 2. Thus, the first connection electrode 4 can be connected to the contact part 65 such that space is transformed from a first space to a second space.

The insertion parts 61 of the contactor 6 to be inserted into the contactor mounting holes of the space transformer 2 have spring characteristics in the shape of doglegs or reversed doglegs as shown in FIGS. 12a to 12d, or in the shape of "C" or reversed "C" as shown in FIGS. 13a to 13d, which come in contact with the inside of the contactor mounting holes with pressure.

The insertion parts 61 may be a combination in the shape of doglegs or maybe a combination in the shape of reversed doglegs, each other in the opposite direction as shown in FIG. 11 or FIG. 12a and 12b, or may be a combination in the shape of doglegs or may be a combination in the shape of reversed doglegs, each other in the same direction as shown in FIGS. 12c and 12d.

Alternatively, the insertion parts 61 may be a combination in the shape of "C" or may be a combination in the shape of reversed "C", each other in the opposite direction as shown in FIGS. 13a and 13b, or may be C-shaped or may be reversely C-shaped in the same direction as shown in FIGS. 13c and 13d.

In addition, the insertion parts 61 may be a combination of the doglegged configuration and the C-shaped configuration or may be a combination of those in the different direction although they are not shown.

Here, since it is a major point of the present invention that the insertions parts 61 are in contact with the contactor mounting holes with spring characteristics, it is needless to say that they are not limited to the doglegged configuration nor the C-shaped configuration.

It is preferable that the support part 62 is thicker than other parts in the contactor 6 so as to be hardly bent to surely support the insertion parts 61.

The contactor 6 is preferably made from an electrically well-conductive metal material such as copper (Cu), nickel (Ni) or the like by etching, pressing or electroforming and plated with gold (Au) or tin (Sn) after the contact part 65 and the electrode part 66 are molded and polished. According those processing method, since it can be molded without bending the metal, metal fatigue caused by bending processing does not remain, so that spring characteristics will not deteriorate even after repeatedly used and excellent durability can be provided.

FIG. 14 shows an example in which the support part 62 is off the space transformer 2, so that space shown by "x'" therein is provided to pass the wiring pattern between the two insertion parts 61. This is applied to a case where stability at the time of mounting is increased by taking much space between the insertion parts 61, and the contactor mounting holes.

FIG. 15 shows an example in which the arm part 64 does not have a curve part and it has a linear configuration. The configuration of the arm part 64 can be appropriately changed depending on the configuration of the semiconductor device to be measured.

FIG. 16 shows an example in which plate spring parts 67 are provided so as to be adjacent to the linear arm part 64 and sandwiched between the arm part 64 and the insertion parts 61. In this structure, spring pressure is gradually increased depending on a deformation amount of the arm part 64 and the contact part 65 can be surely in contact with the electrode of the object to be tested. Although two spring parts 67 are provided in FIG. 16, it is needless to say that it may be provided one, or two or more.

FIG. 17 shows an example in which the electrode part 66 in an example shown in FIG. 10 protrudes in the opposite direction from the arm part 64 (including the curve part 63). It can be appropriately changed depending on the configuration of the semiconductor device to be measured.

FIG. 18 shows an example in which the electrode part 66 in an example shown in FIG. 10 protrudes from both sides of the support part 62. The combination of the contactor 6 and the space transformer 2 in this structure may be applied to a part in which especially conduction is to be enhanced and contact resistance is to be reduced such as a power supply line and the like.

FIG. 19 shows an example in which the electrode part 66 in an example shown in FIG. 15 protrudes in the same direction as the arm part 64, FIG. 20 shows an example in which the electrode part 66 in an example shown in FIG. 15 protrudes from both sides of the support part 62, FIG. 21 shows an example in which the electrode part 66 in an example shown in FIG. 16 protrudes in the same direction as the arm part 64 and the spring part 67, and FIG. 22 shows an example in which the electrode part 66 in an example shown in FIG. 16 protrudes from both sides of the support part 62. They are selectively used according to need like in examples shown in FIGS. 17 and 18.

As described above, although various kinds of examples of configurations are illustrated, it is needless to say that the present invention is not limited to the illustrated configurations of the contactors.

As described above, the probe card of the present invention is a probe card having a contactor mounting substrate (space transformer) on which a plurality of contactors are provided, in which the contactor comprises an insertion part for mounting the contactor on the substrate, a support part for supporting the insertion part and performing positioning in the height direction by contacting the surface of the contactor mounting substrate, an arm part extending from the support part and a contact part arranged at a tip end of the arm part to come in contact with the electrode of the object to be tested, and the insertion part is detachably inserted into an electrode hole provided on the surface of the contactor mounting substrate and made to be electrically conductive by the wiring pattern. Thus, only contactor can be exchanged without detaching the contactor mounting substrate (space transformer), so that it can be highly effective in terms of time and economical efficiency.

In addition, according to the probe card of the present invention, since a plurality of electrode holes which are made to be conductive by the wiring pattern on the surface of the contactor mounting substrate (space transformer) are provided for one contactor and the one contactor has a plurality of insertion parts, the contactor can be surely positioned, mounted, fixed, so that it can surely come in contact with the object to be tested for long period.

In addition, according to the probe card of the present invention, since the insertion part of the contactor has the spring characteristics, and it is inserted into the electrode hole provided in the surface of the contactor mounting substrate (space transformer) and made to be conductive by the wiring pattern, and comes in contact with the inside of the electrode hole so as to be pressed, the contactor mounting substrate can be surely connected to the contactor and their contact can be surely provided for long period even after the contactor is exchanged repeatedly.

In addition, since the contactor for the probe card of the present invention comprises the insertion part having the spring characteristics, the support part for supporting the insertion part and performing the positioning in the height direction by the contact with the contactor mounting substrate, the arm part extending from the support part, and the contact part arranged at the tip end of the arm part and coming in contact with the electrode of the object to be tested, when it is mounted on the contactor mounting substrate, it can be easily mounted on the substrate without soldering and the like, so that a stable contact can be provided.

In addition, the contactor for the probe card of the present invention has a plurality of insertions parts inserted into the contactor mounting substrate, whose number is the same as or less than the number of the electrode holes. Since the contactor has a plurality of insertion parts, the direction of the contactor can be decided and the contactor can be more surely positioned, mounted and fixed.

Besides, according to the contactor for the probe card of the present invention, since the arm part has the spring characteristics, the contact pressure pressed against the electrode of the object to be tested can be controlled and the contact pressure can be stably provided.

Besides, according to the contactor for the probe card of the present invention, since the arm part is curved, it can correspond to an arrangement of a narrow pitch, so that various kinds of objects to be tested, which are highly integrated can be measured.

Besides, according to the contactor for the probe card of the present invention, since the arm part is linear and the plate spring part is provided so as to be adjacent to the linear arm part and sandwiched between the arm part and the insertion part, the spring pressure is gradually increased in accordance with the displacement amount of the arm part and the contact with the electrode of the object to be tested can be surely provided.

The probe card of the present invention is a probe card having a contactor mounting substrate (space transformer) on which a plurality of contactors are provided, in which the contactor comprises an insertion part for mounting the contactor on the contactor mounting substrate, a support part for supporting the insertion part and performing positioning in the height direction by contacting the surface of the contactor mounting substrate, an electrode part extending from the support part, an arm part also extending from the support part, and a contact part arranged at a tip end of the arm part to come in contact with the electrode of the object to be tested, the insertion part is detachably mounted onto the contactor mounting hole provided in the surface of the contactor mounting substrate, and the electrode part is made to be conductive by contacting the electrode provided in the wiring pattern on the contactor mounting substrate. Thus, only contactor can be exchanged without detaching the contactor mounting substrate (space transformer), so that it can be highly effective in terms of time and economical efficiency.

In addition, according to the probe card of the present invention, since a plurality of contactor mounting holes which are provided on the surface of the contactor mounting substrate (space transformer) are provided for one contactor and the one contactor has a plurality of insertion parts whose number is less than the number of the contactor mounting holes, the contactor can be surely positioned, mounted, fixed, so that it can surely come in contact with the object to be tested for long period.

In addition, according to the probe card of the present invention, since the electrode part of the contactor has the spring characteristics, and it is pressed against the electrode provided on the surface of the contactor mounting substrate (space transformer) and made to be conductive by the wiring pattern so as to be in contact with the electrode with pressure, the contactor mounting substrate can be surely connected to the contactor and their contact can be surely provided for long period even after the contactor is exchanged repeatedly.

In addition, according to the probe card of the present invention, since the specific electrode is provided, the plating in the hole is not indispensable, so that unstable conduction because of the plating defect in the hole can be prevented as compared with the case the inside of the contactor mounting hole is plated to become the electrode hole by the wiring pattern.

In addition, according to the contactor for the probe card of the present invention, since the contactor comprises an insertion part having the spring characteristics for mounting the contactor on the contactor mounting substrate, the support part for supporting the insertion part and performing the positioning in the height direction by contacting the surface of the contactor mounting substrate, the electrode part extending from the support part, the arm part also extending from the support part, and the contact part arranged at the tip end of the arm part and coming in contact with the electrode of the object to be tested, when it is mounted on the contactor mounting substrate, it can be easily mounted on the substrate without soldering and the like and a stable contact can be provided.

In addition, the contactor for the probe card of the present invention has a plurality of insertion parts inserted into the contactor mounting substrate, whose number is the same as or less than the number of the electrode holes. Since it has a plurality of insertion parts, the direction of the contactor can be decided and the contactor can be surely positioned, mounted and fixed.

Furthermore, according to the contactor for the probe card of the present invention, the pressed contact is sufficiently provided by the electrode part having the spring characteristics, so that the contactor mounting substrate can be surely connected to the contactor.

Besides, according to the contactor for the probe card of the present invention, since the arm part has the spring characteristics, the contact pressure pressed against the electrode of the object to be tested can be controlled and the contact pressure can be stably provided.

Besides, according to the contactor for the probe card of the present invention, since the arm part is curved, it can correspond to an arrangement of a narrow pitch, so that various kinds of objects to be tested, which are highly integrated can be measured.

Besides, according to the contactor for the probe card of the present invention, the arm part is linear and the plate spring part is provided so as to be adjacent to the linear arm part and sandwiched between the arm part and the insertion part, the spring pressure is gradually increased in accordance with the displacement amount of the arm part and the contact with the electrode of the object to be tested can be surely provided.

What is claimed is:

1. A probe card for measuring electrical characteristics of a semiconductor device, the probe card comprising:
   electrical wiring;
   electrodes that are electrically connected to said electrical wiring;
   contactor mounting substrates comprising mounting holes to mount contactors; and
   a plurality of contactors that are integrally molded by well-conducting metal material and that connect between an electrode of the object to be tested and the said electrodes on the said contactor mounting substrate; wherein said contactors comprise:
   an insertion part having spring characteristics, wherein the insertion part comes in contact with the inside of the mounting holes with pressure being inserted into the contactor mounting holes on the contactor mounting substrate;
   a support part for supporting the insertion part and performing positioning in the height direction by contacting a surface of the contactor mounting substrate;
   an arm part having spring characteristics and extending from the support part; and
   a contact part arranged at a tip end of the arm contact part to come in contact with the electrode of an object to be tested.

2. The probe card according to claim 1, wherein a plurality of said electrode holes which are made to be conductive by the wiring pattern on the surface of said contactor mounting substrate are provided for one contactor.

3. A contactor for a probe card for measuring electrical characteristics of a semiconductor device; the contactor to be mounted on a contactor mounting substrate comprising contactor mounting holes; said contactor being integrally molded by well-conductive metal material; and said contactor comprises:
   an insertion part having spring characteristics, wherein the insertion part- comes in contact with an inside of mounting holes with pressure being inserted into the contactor mounting holes on the contactor mounting substrate;
   a support part for supporting the insertion part and performing positioning in the height direction by contacting a surface of the contactor mounting substrate;
   an arm part having the spring characteristics and extending from the support part; and
   a contact part arranged at a tip end of the arm part to come in contact with an electrode of an object to be tested.

4. The contactor for the probe card according to claim 3, wherein the contactor has a plurality of insertion parts to be inserted into the contactor mounting substrate, whose number is the same as or less than the number of electrode holes for one contactor.

5. The contactor for the probe card according to claim 3, wherein the arm part of the contactor has a curved configuration.

6. The contactor for the probe card according to claim 3, wherein the arm part of the contactor is linear and a plate spring part is provided so as to be adjacent to the linear arm part and sandwiched between the arm part and the insertion part.

7. A probe card for measuring electrical characteristics of the semiconductor device, comprising:
   electrical wiring;
   electrodes that are electrically connected to said electrical wiring;
   contactor mounting substrate comprising mounting holes to mount contactors; and
   a plurality of contactors that are integrally molded by well-conducting metal material and that connect between an electrode of the object to be tested and the said electrode on the said contactor mounting substrate; and wherein said contactors comprise:
      an insertion part having spring characteristics and comes in contact with the inside of the mounting holes with pressure being inserted into the contactor mounting holes on the contactor mounting substrate;
      a support part for supporting the insertion part and performing positioning in the height direction by contacting a surface of the contactor mounting substrates;
      an electrode part extending from the support part, and in contact with a wiring pattern on the contactor mounting substrate;
      an arm part having the spring characteristics and extending from the support part; and
      a contact part arranged at a tip end of the arm part to come in contact with the electrode of an object to be tested.

8. The probe card according to claim 7, wherein a plurality of contact or mounting holes of the contact or mounting substrate are provided for one contactor.

9. The probe card according to claim 7, wherein the electrode part of the contactor to be mounted on the contactor mounting substrate has spring characteristics and it comes in contact with the wiring pattern on the contactor mounting substrate so as to be pressed.

10. A contactor for a probe card for measuring of electrical characteristics of a semiconductor device; said contactor to be mounted on a contactor mounting substrate having contactor mounting holes; said contactor being integrally molded by well-conductive metal material; and said contactor comprises:
    an insertion part having spring characteristics, wherein the insertion part comes in contact with the inside of the mounting holes with pressure being inserted into the contactor mounting holes on the contactor mounting substrate;
    a support part for supporting the insertion part and performing positioning in the height direction by contacting a surface of the contactor mounting substrate;
    an electrode part extending from the support part and in contact with a wiring pattern on the contactor mounting substrate;
    an arm part having the spring characteristics and extending from the support part; and
    a contact part arranged at a tip end of the arm part to come in contact with an electrode of an object to be tested.

11. The contactor for the probe card according to claim 10, wherein the contactor has a plurality of insertion parts to be inserted into the contactor mounting substrate, whose number is the same as or less than the number of contactor mounting holes for one contactor.

12. The contactor for the probe card according to claim 10, wherein the electrode part of the contactor has spring characteristics.

13. The contactor for the probe card according to claim 10, wherein the arm part of the contactor has a curved configuration.

14. The contactor for the probe card according to claim 10, wherein the arm part of the contactor is linear and a plated spring part is provided so as to be adjacent to the linear arm part and part and sandwiched between the arm part and the insertion part.

* * * * *